(12) United States Patent
Nishioka

(10) Patent No.: US 7,450,678 B2
(45) Date of Patent: Nov. 11, 2008

(54) ASYNCHRONOUS SIGNAL INPUT APPARATUS AND SAMPLING FREQUENCY CONVERSION APPARATUS

(75) Inventor: Naotoshi Nishioka, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 605 days.

(21) Appl. No.: 10/999,884

(22) Filed: Nov. 30, 2004

(65) Prior Publication Data
US 2005/0141033 A1   Jun. 30, 2005

(30) Foreign Application Priority Data
Dec. 4, 2003   (JP)   ............... 2003-406005
Mar. 16, 2004   (JP)   ............... 2004-074609

(51) Int. Cl.
*H04L 7/00* (2006.01)
*H04L 25/00* (2006.01)
*H04L 25/40* (2006.01)

(52) U.S. Cl. ............ 375/372; 710/53; 710/56; 710/61; 710/310; 365/189.05; 365/230.08

(58) Field of Classification Search ............ 375/372; 370/298; 455/186.1; 365/189.05, 230.08; 710/53, 56, 61, 310
See application file for complete search history.

(56) References Cited

U.S. PATENT DOCUMENTS 6,118,344 A * 9/2000 Toshitani et al. ............ 331/1 R
6,263,036 B1   7/2001 Yamamoto

FOREIGN PATENT DOCUMENTS

JP   11-55075   2/1999

* cited by examiner

*Primary Examiner*—Ted Wang
(74) *Attorney, Agent, or Firm*—Pillsbury Winthrop Shaw Pittman LLP

(57) ABSTRACT

In an asynchronous data input apparatus, a writing section writes data successively into a FIFO buffer memory at an variable input rate so that the data are accumulated in the FIFO buffer memory. A reading section reads the accumulated data successively from the FIFO buffer memory at an variable output rate so that the data amount residing in the FIFO buffer memory varies temporally. A detector detects a current data amount residing in the FIFO buffer memory, and a current direction of variation of the data amount residing in the FIFO buffer memory. A loop filter generates control information according to both of the detected current data amount and the detected current direction of variation of the data amount. A controller regulates the output rate according to the control information so as to promptly converge the current data amount residing in the FIFO buffer memory to a target data amount.

8 Claims, 6 Drawing Sheets

FIG. 2

| INCREASE/DECREASE | ΔS | ΔT |
|---|---|---|
| DECREASING | 0 | −16 |
| | 1 | −16 |
| | 2 | −16 |
| | 3 | −16 |
| | 4 | −8 |
| | 5 | −4 |
| | 6 | −4 |
| | 7 | −1 |
| OTHER THAN ABOVE AND BELOW | | 0 |
| INCREASING | 9 | 1 |
| | 10 | 4 |
| | 11 | 4 |
| | 12 | 8 |
| | 13 | 16 |
| | 14 | 16 |
| | 15 | 16 |

ASYNCHRONOUS SIGNAL INPUT APPARATUS AND SAMPLING FREQUENCY CONVERSION APPARATUS

BACKGROUND OF THE INVENTION

1. Technical Field

The present invention relates to an asynchronous signal input apparatus used for stably transferring asynchronous signals between different devices and to a sampling frequency conversion apparatus using the asynchronous signal input apparatus.

2. Related Art

Digital audio devices and the like use various sampling frequencies of sounds such as 32 kHz, 44.1 kHz, and 48 kHz. There may be a case of connecting devices having different sampling frequencies with each other. If a receiving device straight reads a data string of an original signal waveform supplied from a transmitting device, an output signal waveform is deformed along the time direction. The original waveform is not reproduced correctly. To solve this problem, the receiving device uses a sampling frequency conversion apparatus. The sampling frequency conversion apparatus receives an input data string of a first sampling frequency. Based on this input data string, the sampling frequency conversion apparatus generates an output data string of a second sampling frequency that forms a similar signal waveform as for the input data string.

The inventors have proposed this type of sampling frequency conversion apparatus using the FIFO (First In First Out) technique (see patent document 1). Throughout this specification, the technology describe in patent document 1 is referred to as the "conventional sampling frequency conversion apparatus".

The patent document 1 is Japanese Non-examined Patent Publication No. 11-55075, which corresponds to the U.S. Pat. No. 6,263,036.

In the conventional sampling frequency conversion apparatus, input data strings to be processed are sequentially written to a FIFO buffer at a clock of the same frequency as the first sampling frequency. On the other hand, the sampling frequency conversion apparatus generates an output clock having the same frequency as a second sampling frequency. In synchronization with this output clock, the sampling frequency conversion apparatus generates output data string having the second sampling frequency. The output data string has generally the same signal waveform as that of the input data string. Since sampling frequencies are different, sampling points of output and input data strings are generally allotted to different positions along each time axis. To find individual output data of each sampling point constituting an output data string, an interpolation process is performed in synchronization with an output clock using a specified number of input data (hereafter referred to as an interpolation input data string) available before and after the sampling point of the output data. The interpolation process includes two-stage processes. First process is to find phase information indicating a position of a sampling point for output data to be generated along the time axis. Second process is to convolute a coefficient string for interpolation into an interpolation input data string. In this case, the coefficient string for interpolation is prepared corresponding to the phase information. The phase information is generated by accumulating frequency control information having a suitable value each time an output clock occurs. Repeating accumulation of the frequency control information gradually increases the phase information as an accumulation result and moves a sampling point indicated by the phase information. The sampling point indicated by the phase information may exceed a sampling point for the most recent input data in the interpolation input data string. In this case, a read clock is generated at a timing synchronized with the output clock to read the earliest input data string stored in the FIFO buffer. The read input data is added to the interpolation input data string, and the earliest input data in the interpolation input data string is discarded. This process provides an output data string having the similar signal waveform as that of the input data string.

If the frequency of the input clock used for writing input data strings into the FIFO buffer accurately corresponds to the first sampling frequency and the frequency of the output clock used for timing control of the interpolation process accurately corresponds to the second sampling frequency, the frequency control information could be a fixed value equivalent to the ratio between the first sampling frequency and the second sampling frequency. However in practice, no matter how accurate frequencies may be specified for the input clock and the output clock, there is a limit on the precise correspondence among these frequencies and therefore among the first and second sampling frequencies. For example, an input clock frequency may temporally become higher than the first sampling frequency. Alternatively, an output clock frequency may temporally become lower than the second sampling frequency. In these cases, the FIFO buffer contains an increasing amount of remaining data (increasing number of residing input data) with the lapse of time and finally overflows. By contrast, an input clock frequency may temporally become lower than the first sampling frequency. Alternatively, an output clock frequency may temporally become higher than the second sampling frequency. In these cases, the FIFO buffer contains a decreasing amount of remaining data with the lapse of time and finally underflows.

To solve these problems of overflow and underflow, the conventional sampling frequency conversion apparatus is provided with an asynchronous signal input apparatus that increases or decreases the frequency control information in accordance with the amount of data remaining in the FIFO buffer so as to prevent the FIFO buffer from overflowing or underflowing.

More specifically, the asynchronous signal input apparatus compares the remaining data amount in the FIFO buffer with a target value. When the remaining data amount is greater than the target value, the frequency control information is increased to increase a speed of reading input data from the FIFO buffer. When the remaining data amount is smaller than the target value, the frequency control information is decreased to decrease a speed of reading input data from the FIFO buffer. In this manner, the asynchronous signal input apparatus performs a PLL (Phase Locked Loop) operation to prevent the FIFO buffer from overflowing or underflowing. The PLL operation converges the remaining to the target value, so that a chronological or temporal average of phase differences between input data written to the FIFO buffer and input data read from the FIFO buffer is converged to a suitable value.

However, the following defect is recognized when the above-mentioned PLL operation starts in the conventional asynchronous signal input apparatus. If the initial speed to read the FIFO buffer is not set to a suitable value, the remaining data amount in the FIFO buffer continues to vibrate at a given amplitude around a target value. The vibration of the remaining data amount increases its amplitude as there is an increasing difference between the initial read rate and the suitable value. This causes a noise or fluctuation in an output data waveform obtained from the sampling frequency conversion apparatus. To prevent such problem, it is necessary to approximate the initial speed for FIFO reading to the suitable value as much as possible and decrease the amplitude in the vibration of the remaining data amount. However, the suitable value has an individual difference. Even if one suitable value is found for the FIFO read rate in a given sampling frequency conversion apparatus, that suitable value is not necessarily applied to a different sampling frequency conversion apparatus of the same model. For this reason, the conventional sampling frequency conversion apparatus needs to set a suitable value of the FIFO read rate individually for each apparatus and initialize the read rate to that suitable value.

SUMMARY OF THE INVENTION

The present invention has been made in consideration of the foregoing. It is therefore an object of the present invention to provide an asynchronous signal input apparatus and a sampling frequency conversion apparatus capable of sufficiently decreasing the amplitude of variation of the remaining data amount.

To achieve the above-mentioned object, the present invention provides an asynchronous signal input apparatus comprising a storage section that can successively store input data while the stored input data are successively read out such that a remaining data amount of the input data stored in the storage section may temporally vary around a preset target data amount, a write control section that successively writes the input data into the storage section in response to an input clock signal having a first frequency, a remaining data amount detection section that detects the remaining data amount of the input data stored in the storage section, a vector detection section that detects a temporal variation of the remaining data amount of the input data stored in the storage section, a loop filter section that converts an error represented by a differential data amount between the remaining data amount and the preset target data amount into a correction number based on both of the remaining data amount detected by the remaining data amount detection section and the temporal variation of the remaining data amount detected by the vector detection section, and that generates frequency control information based on the correction number, a read signal generation section that generates a read signal composed of a sequence of pulses occurring in synchronization with an output clock signal having a second frequency, such that an occurrence number of the pulses per time is dynamically regulated according to the frequency control information, and a read control section that successively reads out the input data from the storage section in response to the pulses of the read signal regulated by the read signal generation section, so that the remaining data amount of the input data in the storage section converges to the predetermined target data amount.

The present invention controls the correction number based on the remaining data amount in the storage section and its temporal variation so as to efficiently suppress vibration of the remaining data amount. In detail, the loop filter section produces a negative correction number effective to suppress an increase of the remaining data amount if the detected remaining data amount is greater than the predetermined target data amount and the detected temporal variation indicates that the remaining data amount is increasing, and produces a positive correction number effective to suppress a decrease of the remaining data amount if the detected remaining data amount is smaller than the predetermined target data amount and the detected temporal variation indicates that the remaining data amount is decreasing.

In a preferred mode, the vector detection section comprises a memory that stores a plurality of the remaining data amounts which are successively detected by the remaining data amount detection section and which include the last remaining data amount, a controller that operates when there is a difference of ±2 pieces between a new remaining data amount newly detected by the remaining data amount detection section and the last remaining data amount stored in the memory for storing the new remaining data amount detected by the remaining data amount detection section into the memory, and a detector that detects the temporal variation of the remaining data amount based on the plurality of the remaining data amounts which are stored in the memory and which include the last remaining data amount and the new remaining data amount.

According to this mode, it is possible to minimize fluctuation of the remaining data amount under the converged state and also minimize normal vibrations of the read rate of the input data storage section.

In a preferred mode, the present invention is embodied as a sampling frequency conversion apparatus comprising a storage section that can successively store input data while the stored input data are successively read out such that a remaining data amount of the input data stored in the storage section may temporally vary around a preset target data amount, a write control section that successively writes the input data into the storage section in response to an input clock signal having a first frequency, a remaining data amount detection section that detects the remaining data amount of the input data stored in the storage section, a vector detection section that detects a temporal variation of the remaining data amount of the input data stored in the storage section, a loop filter section that converts an error represented by a differential data amount between the remaining data amount and the preset target data amount into a correction number based on both of the remaining data amount detected by the remaining data amount detection section and the temporal variation of the remaining data amount detected by the vector detection section, and that generates frequency control information based on the correction number, a read signal generation section that generates a read signal composed of a sequence of pulses occurring in synchronization with an output clock signal having a second frequency, such that an occurrence number of the pulses per time is dynamically regulated according to the frequency control information, a read control section that successively reads out the input data from the storage section in response to the pulses of the read signal regulated by the read signal generation section, so that the remaining data amount of the input data in the storage section converges to the predetermined target data amount, an interpolation information generation section that generates interpolation information at each timing when the output clock signal is generated by the second frequency while the interpolation information is controlled based on the frequency control information generated from the loop filter section, and an interpolation section that performs an interpolation operation to the input data read out from the storage section in accordance with the interpolation information generated by the interpolation information generation section so as to output interpolated input data corresponding to the timing when the output clock signal is generated.

Further, an inventive method is designed for controlling data input and output operation of a FIFO buffer memory to regulate a data amount residing in the FIFO buffer memory around a target data amount. The inventive method comprises the steps of writing data successively into the FIFO buffer memory at an variable input rate so that the data are accumulated in the FIFO buffer memory, reading the accumulated data successively from the FIFO buffer memory at an variable output rate so that the data amount residing in the FIFO buffer memory varies temporally, detecting a current data amount residing in the FIFO buffer memory, detecting a current direction of variation of the data amount residing in the FIFO buffer memory, generating control information according to both of the detected current data amount and the detected current direction of variation of the data amount, and regulating the output rate according to the control information so as to promptly converge the current data amount residing in the FIFO buffer memory to the target data amount.

In a practical form, the generating step generates negative control information effective to decrease the output rate if the detected current data amount is greater than the target data amount and the detected current direction of the variation indicates that the residing data amount is increasing, and generates positive control information effective to increase the output rate if the detected current data amount is smaller than the target data amount and the detected current direction of the variation indicates that the residing data amount is decreasing.

BRIEF DESCRIPTION OF THE DRAWINGS

FIG. 2 shows a conversion table used in the apparatus.

DETAILED DESCRIPTION OF THE INVENTION

The sampling frequency conversion apparatus as an embodiment of the present invention will be described in further detail with reference to the accompanying drawings.

Figure 1:
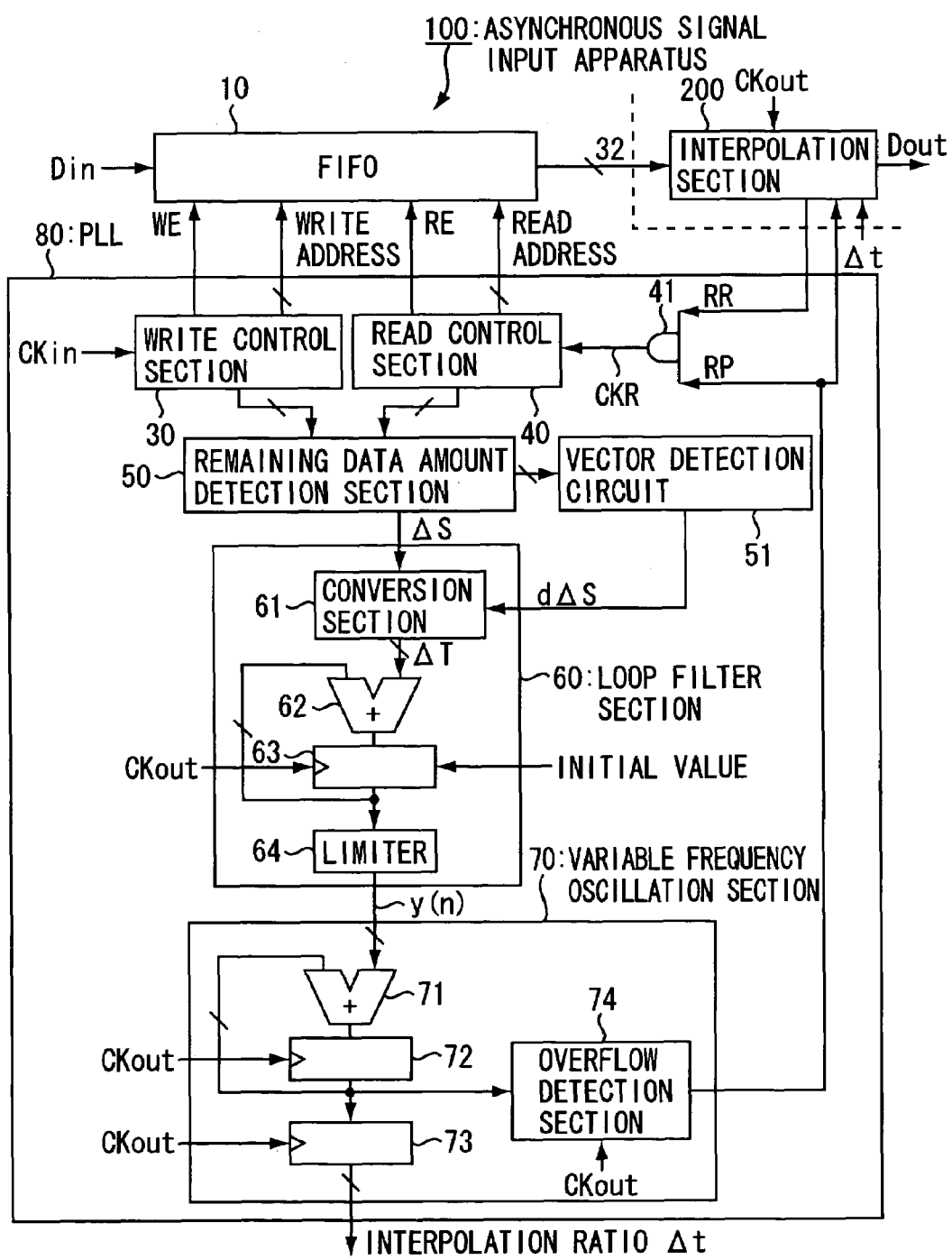
FIG. 1 is a block diagram showing the configuration of the sampling frequency conversion apparatus according to the embodiment.

FIG. 1 is a block diagram showing the configuration of the sampling frequency conversion apparatus according to the embodiment.

The sampling frequency conversion apparatus receives a string of input data Din at first sampling frequency $f_1$. Based on the string of input data Din, the sampling frequency conversion apparatus generates a string of output data Dout at second sampling frequency $f_2$ that shows the equivalent signal waveform as that of input data Din. The sampling frequency conversion apparatus provides timing control of a process to generate and output an output data string. For this purpose, a clock generation circuit (not shown) generates output clock CKout having the same frequency as the second sampling frequency $f_2$.

The sampling frequency conversion apparatus broadly comprises an asynchronous signal input apparatus 100 and an interpolation section 200. The asynchronous signal input apparatus 100 has three functions. When the sampling frequency conversion apparatus receives and stores an input data string at the first sampling frequency $f_1$ and the interpolation section 200 requires new input data, the first function supplies the interpolation section 200 with the new data at a timing synchronized with output clock CKout. Each time output clock CKout occurs, the second function updates interpolation ratio $\Delta$ representing the phase of a sampling point for output data to be generated in the interpolation section 200 and supplies interpolation ratio $\Delta t$ to the interpolation section 200. The third function controls frequency control information as an increment of interpolation ratio $\Delta t$. While input data is supplied via the asynchronous signal input apparatus 100, the interpolation section 200 functions as means for storing the specified number of pieces of these input data in the past as an interpolation input data string. At a timing when output clock CKout occurs, the interpolation section 200 also functions as means for convoluting an interpolation coefficient string dependent on interpolation ratio $\Delta t$ at that time into the interpolation input data string and generating output data.

The following describes the configuration of the asynchronous signal input apparatus 100.

FIFO 10 is a first-in first-out buffer comprising RAM (Random Access Memory) or the like and is capable of storing up to 16 pieces of 32-bit input data. The FIFO 10 temporarily stores input data Din supplied from an external transmitting device and sequentially transfers input data Din from the earliest one. The write control section 30 generates a write address and write enable signal WE and supplies them to the FIFO 10 in accordance with input clock Ckin having the same frequency as sampling frequency $f_1$ for input data Din. When input data Din is supplied to the FIFO 10, write enable signal WE writes input data Din to an area specified by a write address in the FIFO 10.

When an AND gate 41 outputs read clock CKR, a read control section 40 generates a read address and read enable signal RE and supplies them to the FIFO 10. Control is provided to specify the earliest read address out of unread input data remaining in the FIFO 10. The input data specified by this read address is read from the FIFO 10 in response to read enable signal RE and is supplied to the interpolation section 200. The AND gate 41 outputs read clock CKR when supplied with read permission signal RP and read request signal RR. Read permission signal RP and read request signal RR will be described later in more detail.

A remaining data amount detection section 50 is a circuit to detect a difference between the write address generated from the write control section 30 and the read address generated from the read control section 40. That is to say, that difference signifies remaining data amount $\Delta S$ equivalent to the number of pieces of unread input data currently remaining in the FIFO 10. A vector detection circuit 51 detects a temporal variation in remaining data amount $\Delta S$ output from the remaining data amount detection section 50 and outputs vector $d\Delta S$ indicating a mode of the temporal variation.

The vector detection circuit 51 has three pointers Valid0, Valid1, and Valid_ptr. Pointer Valid_ptr stores current remaining data amount $\Delta S$. The following equation (1) shows an update condition. If this condition is satisfied, the value of pointer Valid_ptr is substituted by pointer Valid0. The value of pointer Valid0 so far is substituted by pointer Valid1.

$$\text{Valid\_}ptr=\text{Valid0}\pm 2 \tag{1}$$

Pointer Valid1 stores the remaining data amount immediately before pointer Valid0. Accordingly, in the case of Valid0>Valid1, it is generally assumed that remaining data amount $\Delta S$ is increasing in the FIFO 10. In the case of Valid0<Valid1, it is assumed that remaining data amount $\Delta S$ is decreasing in the FIFO 10. However, remaining data amount $\Delta S$ may change from the increasing state to the decreasing state or from the decreasing state to the increasing state. Such change cannot be determined only with reference to pointers Valid0 and Valid1. To solve this problem, the vector detection circuit 51 according to the embodiment references the three pointers Varid0, Valid1, and Valid_ptr to output vector dΔS that indicates modes of the temporal variation in remaining data amount ΔS. The detail will be described later.

The remaining data amount detection section 50 outputs remaining data amount ΔS that indicates the remaining data amount of data in the FIFO 10. In addition, remaining data amount ΔS indicates a phase difference between data Din last written by input clock Ckin and data Din last read by read clock CKR. The vector detection circuit 51 outputs vector dΔS that indicates a temporal variation of the phase difference. The read control section 40, the write control section 30, the AND gate 41, the remaining data amount detection section 50, the vector detection circuit 51, a loop filter section 60, and a variable frequency oscillation section 70 constitute a PLL 80 that converges the phase difference on a specified target phase difference.

The loop filter section 60 comprises a conversion section 61, a first full adder 62, a first latch circuit 63, and a limiter 64.

The conversion section 61 stores a conversion table as shown in FIG. 2. According to this conversion table, the conversion section 61 converts remaining data amount ΔS and vector dΔS into correction number ΔT. The embodiment uses the suitable target value "8" for the remaining data amount in the FIFO 10. In FIG. 2, in a case, the remaining data amount ΔS is smaller than the suitable value "8" and the vector dΔS shows that the remaining data amount ΔS is is decreasing. In this case, the conversion section 61 outputs negative correction number ΔT whose size is equivalent to a difference between remaining data amount ΔS and the suitable value. By contrast, in another case, the remaining data amount ΔS is larger than the suitable value "8" and the vector dΔS shows that the remaining data amount ΔS is increasing. In this case, the conversion section 61 outputs positive correction number ΔT whose size is equivalent to a difference between remaining data amount ΔS and the suitable value. The size of correction number ΔT is equivalent to that resulting from applying a non-linear transformation to remaining data amount ΔS. On the other hand, in some cases, the remaining data amount ΔS is smaller than the suitable value "8" and the vector dΔS does not show that the remaining data amount ΔS is decreasing, or the remaining data amount ΔS is larger than the suitable value "8" and the vector dΔS does not show that remaining data amount ΔS is increasing. In such cases, the conversion section 61 outputs correction number ΔT whose value is set to "0". The case of setting the correction number ΔT with "0" includes a case where the direction of the temporal variation is changing while the remaining data amount does not changes.

Figure 3:
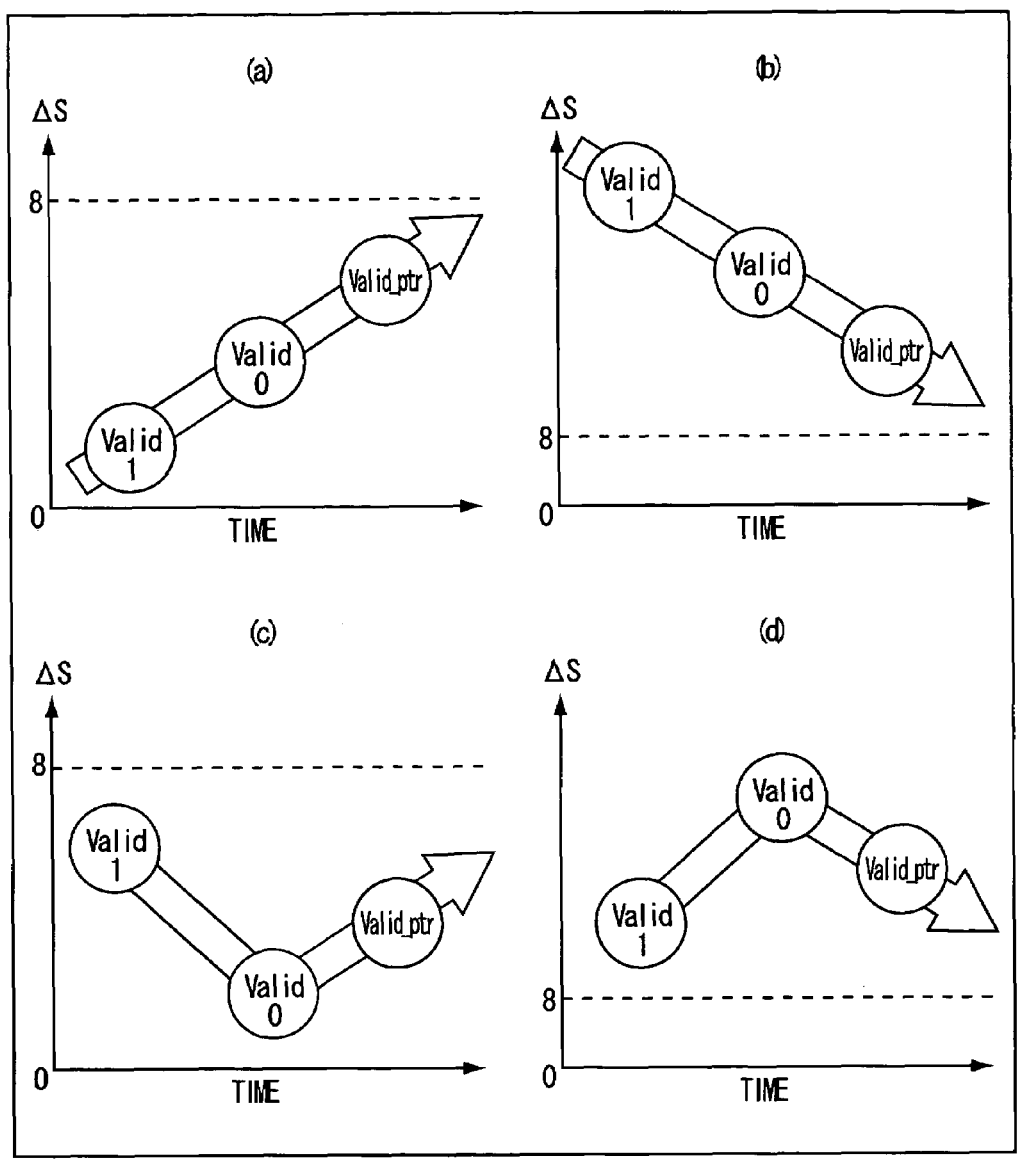
FIG. 3 shows examples of setting correction number $\Delta T$ to "0" in the apparatus.

FIGS. 3(a) through 3(d) show examples of correction number ΔT set to "0". In the example of FIG. 3(a), pointer Vaild_ptr indicates that the current remaining data amount ΔS is smaller than suitable value "8". As indicated by pointers Vaild_ptr, Valid1, and Valid0, remaining data amount ΔS is increasing toward suitable value "8". Therefore, correction number ΔT is assumed to be "0". In the example of FIG. 3(b), pointer Vaild_ptr indicates that the current remaining data amount ΔS is larger than suitable value "8". As indicated by pointers Vaild_ptr, Valid1, and Valid0, remaining data amount ΔS is decreasing toward suitable value "8". Therefore, correction number ΔT is assumed to be "0". FIG. 3(c) shows that remaining data amount ΔS changes from the decreasing state to the minimum value, and then to the increasing state. This example shows that remaining data amount ΔS is decreasing because Valid1 and Valid0 show the relationship of Valid0<Valid1. Because of Vaild_ptr≦8, the current remaining data amount ΔS is smaller than suitable value "8". Judging only from pointers Valid1 and Valid0, remaining data amount ΔS seems to be decreasing. Because of Vaild_ptr>Valid0, the vector detection circuit 51 determines that remaining data amount ΔS changes from the decreasing state to the increasing state and outputs vector dΔS indicative of this change. In this case, correction number ΔT is assumed to be "0". FIG. 3(d) shows that remaining data amount ΔS changes from the increasing state to the maximum value, and then to the decreasing state. This example shows that remaining data amount ΔS is increasing because Valid1 and Valid0 show the relationship of Valid0>Valid1. Because of Vaild_ptr≧8, the current remaining data amount ΔS is larger than suitable value "8". Judging only from pointers Valid1 and Valid0, remaining data amount ΔS seems to be increasing. Because of Vaild_ptr>Valid0, the vector detection circuit 51 determines that remaining data amount ΔS changes from the increasing state to the decreasing state and outputs vector dΔS indicative of this change. In this case, correction number ΔT is assumed to be "0".

There have been described in detail the processes performed by the remaining data amount detection section 50, the vector detection circuit 51, and the conversion section 61.

The full adder 62 performs an operation as shown in the following equation (2) based on correction number ΔT and value y(n) supplied from the first latch circuit 63. The following y(n+1) is output data from the first full adder 62 and is latched by the first latch circuit 63 at a timing synchronized with output clock Ckout. The limiter limits the data to a value smaller than or equal to a specified upper bound. The data is output from the loop filter section 60 as frequency control information and is supplied to the variable frequency oscillation section 70.

$$y(n+1)=y(n)+\Delta T \quad (2)$$

The first latch circuit 63 is configured to be capable of initialization. When the sampling frequency conversion apparatus starts operating, the first latch circuit 63 is assigned a specified value as initial value y(0).

The variable frequency oscillation section 70 comprises a second full adder 71, a second latch circuit 72, a third latch circuit 73, and an overflow detection section 74. The second latch circuit 72 latches output data from the second full adder 71 in synchronization with output clock Ckout and again feeds that data back to the second full adder 71. That is to say, the second full adder 71 accumulates frequency control information y(n) at an interval of output clock Ckout. Frequency control information y(n) is supplied as output data from the loop filter section 60. An output from the second latch circuit 72 is fed back to the second full adder 71 and is delayed by the third latch circuit 73 for one clock frequency of output clock CKout. The result is supplied as interpolation ratio Δt to the interpolation section 200.

Interpolation ratio Δt has an upper bound. If an accumulation result of frequency control information y(t) exceeds this upper bound, an excess becomes new interpolation ratio Δt. The overflow detection section 74 outputs the above-mentioned read permission signal RP when interpolation ratio Δt output from the second latch circuit 72 decreases, i.e., when it is determined that an accumulation result of frequency control information y(t) exceeds the upper bound and an excess becomes new interpolation ratio Δt. The read permission signal RP is transmitted from overflow detection section 74 to the AND gate 41 and the interpolation section 200 when interpolation ratio Δt after the overflow is supplied to the interpolation section 200 from the third latch circuit 73.

The interpolation section 200 has a shift register to store interpolation input data strings. The interpolation section 200 convolutes a coefficient string for interpolation into output data from each stage of that shift register. The coefficient string for interpolation corresponds to interpolation ratio Δt supplied from the third latch circuit 73. The interpolation section 200 outputs a convolution result as output data Dout at a timing in synchronization with output clock CKout. When receiving data read permission signal RP, the interpolation section 200 outputs read request signal RR at a timing in synchronization with output clock CKout. When this read request signal RR is output, read permission signal RP is then output. The AND gate 41 transmits read clock CKR to the read control section 40. The read control section 40 increments the read address by "1" and outputs read enable signal RE. As a result, the earliest unread data in the FIFO 10 is read and is supplied to the interpolation section 200. The interpolation section 200 writes data supplied from the FIFO 10 to the first stage of the shift register. Existing data in the shift register is sequentially shifted to subsequent stages. Data at the last stage is discarded.

Figure 4:
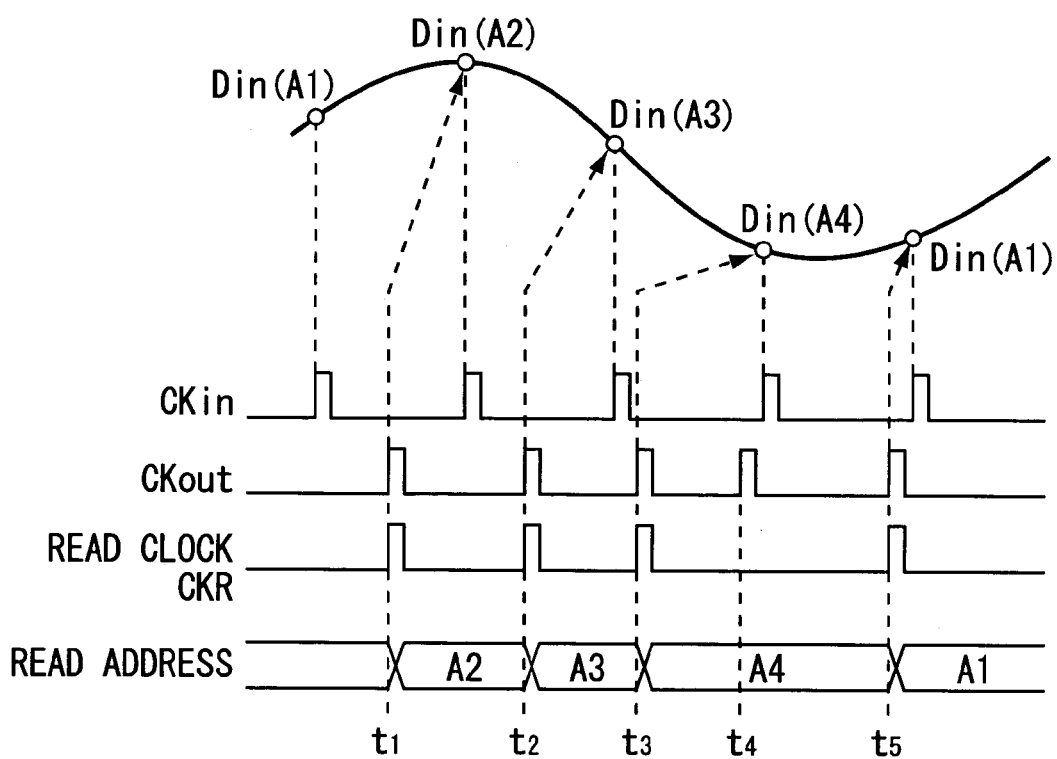
FIG. 4 is a timing chart showing operations of the apparatus.

FIG. 4 is a timing chart showing operations of the asynchronous signal input apparatus according to the embodiment. As mentioned above, input data Din as a signal waveform sample is supplied to the FIFO 10 in synchronization with input clock Ckin having the same frequency as sampling frequency $f_1$. The FIFO 10 has areas corresponding to 16 addresses "A1" through "A16". Each time input clock Ckin occurs, the write control section 30 supplies write enable signal WE to the FIFO 10 and cyclically changes write addresses in a sequential order of "A1" and "A2" through "A16", then "A1" and so on to be supplied to the FIFO 10. This operation specifies the areas corresponding to addresses "A1" through "A16" in the FIFO 10 as write destinations to sequentially write input data Din. In FIG. 4, input data Din is written to an address "Ax", where x is one of 1 through 16, in FIFO 10 and is represented as Din(Ax).

Each time the AND gate 41 supplies read clock CKR, the read control section 40 supplies the FIFO 10 with read enable signal RE and the read address. At this time, the read control section 40 cyclically changes read addresses to be supplied with the read enable signal in a sequential order of "A1" and "A2" through "A16", then "A1" and so on.

The remaining data amount detection section 50 outputs remaining data amount ΔS, i.e., a difference between the write address and the read address supplied to the FIFO 10. This ΔS represents not only the remaining data amount in the FIFO 10, but also a phase difference between data Din written to the FIFO 10 and data Din read from the FIFO 10. The vector detection circuit 51 outputs vector dΔS that indicates a mode of temporal variation in remaining data amount ΔS. The conversion section 61 generates correction number ΔT based on remaining data amount ΔS and vector dΔS. In this manner, the first full adder 62 and subsequent circuits in the loop filter section 60 average correction numbers ΔT sequentially output from the conversion section 61 along the time axis and outputs a result as frequency control information y(n).

Each time output clock CKout is supplied, the variable frequency oscillation section 70 accumulates frequency control information y(n) to calculate interpolation ratio Δ. Each time interpolation ratio Δt overflows during this accumulation process, read permission signal RP occurs and read clock CKR occurs accordingly. A time density generated from read clock CKR depends on frequency control information y(n). Large frequency control information y(n) causes a large time density from read clock CKR. By contrast, small frequency control information y(n) causes a small time density from read clock CKR. A change of the time density in read clock CKR is reflected on remaining data amount ΔS in the FIFO 10. That is to say, increasing the time density in read clock CKR decreases remaining data amount ΔS. Decreasing the time density in read clock CKR increases remaining data amount ΔS. The PLL 80 provides feedback control to converge remaining data amounts ΔS on the suitable value based on remaining data amount ΔS and vector dΔS indicating a mode of its temporal variation. As a result of execution of the feedback control, read clock CKR is generated in synchronization with output clock CKOut having the same frequency as the second sampling frequency $f_2$. However, the pulse occurrence density per time of the read clock CKR converges to an equivalent of the first sampling frequency $f_1$. Namely, the occurrence number of read clock pulses per time indicates the read rate of the FIFO buffer 10, and this occurrence number of the read clock pulses converges to the first sampling frequency $f_1$ through the feedback control while the read clock signal is generated in synchronization with the second sampling frequency $f_2$. Stated otherwise, the read clock pulses are thinned dynamically according to the corrective frequency control information so that the effective frequency of the read clock pulses converges to the first sampling frequency $f_1$ rather than the second sampling frequency $f_2$.

In the example of FIG. 4, output clock CKout occurs at times $t_1$, $t_2$, $t_3$, $t_4$, and $t_5$. Read clock CKR occurs in synchronization with output clock CKout at times $t_1$, $t_2$, $t_3$, and $t_5$. No read clock CKR occurs at time $t_4$. In this manner, the embodiment generates read clock CKR having a time density equivalent to the first sampling frequency $f_1$ in the mode to appropriately skip individual output clocks CKout. Read clock CKR is generated in this manner and is used so that input data Din in the FIFO 10 are sequentially read from the earliest one and are supplied to the interpolation section 200. The interpolation section 200 convolutes an interpolation coefficient string corresponding to interpolation ratio Δt into the specified number of data supplied as mentioned above in the past. The resulting output data Dout is output in synchronization with output clock CKout having the second sampling frequency $f_2$.

Figure 5:
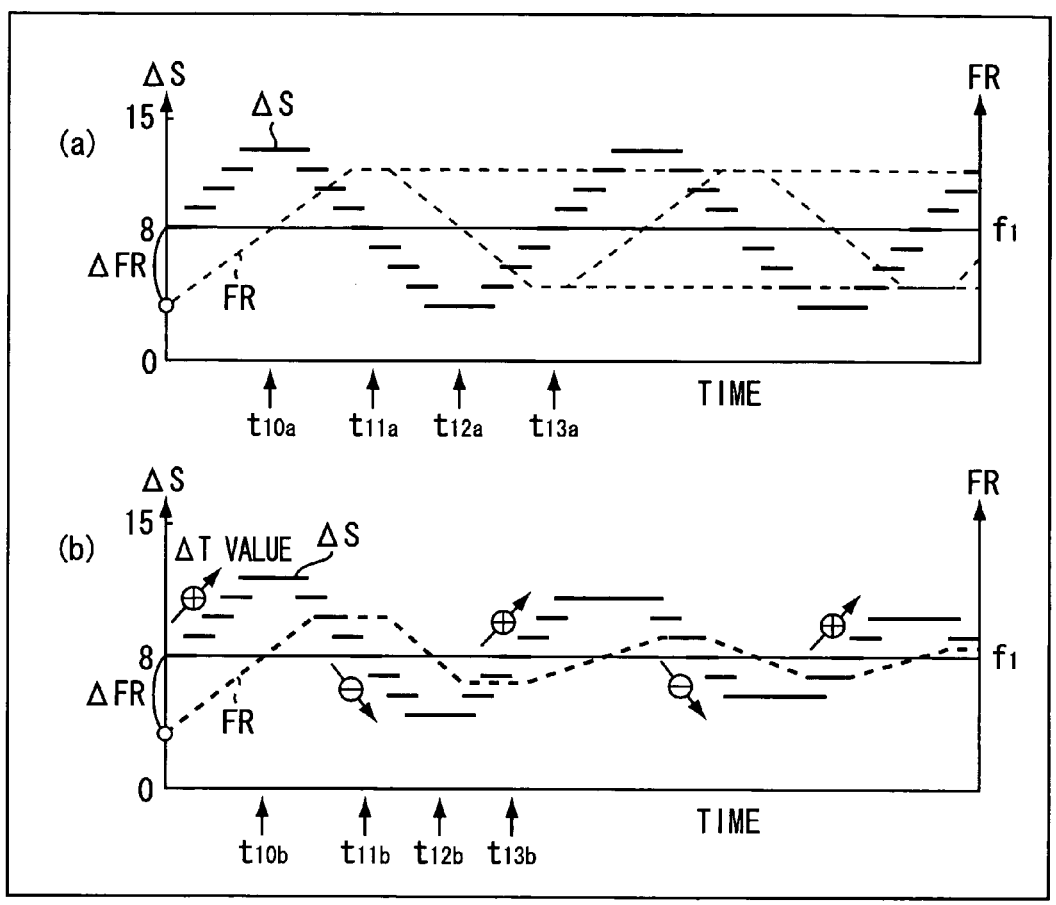
FIG. 5 shows temporal variations of remaining data amount $\Delta S$ of FIFO and read rate FR in the apparatus.

With respect to the above-mentioned operations, the first feature of the embodiment lies in that consideration is given to not only remaining data amount ΔS, but also vector dΔS indicating modes of its temporal variation so as to generate correction number ΔT for changing frequency control information y(n). FIG. 5(a) shows remaining data amount ΔS in the FIFO 10 and read rate (time density of read clock CKR) FR according to the prior art. In FIG. 5(a), no consideration is given to control over correction number ΔT, i.e., vector dΔS. When remaining data amount ΔS is larger than the suitable value, control is provided to generate positive correction number ΔT correspondingly sized to a difference between remaining data amount ΔS and the suitable value. When remaining data amount ΔS is smaller than the suitable value, control is provided to generate negative correction number ΔT correspondingly sized to a difference between remaining data amount ΔS and the suitable value. By contrast, FIG. 5(b) shows remaining data amount ΔS in the FIFO 10 and read rate FR according to the embodiment. In FIG. 5(b), control is provided over correction number ΔT, i.e., providing control to generate correction number ΔT based on both remaining data amount ΔSand vector dΔS. With reference to FIGS. 5(a) and 5(b), the following describes effects of the embodiment.

In the example of FIG. 5(a), read rate FR is set to an initial value corresponding to specified amount ΔFR lower than the suitable value, i.e., a speed equivalent to the first sampling frequency $f_1$. After the initial value is assigned to the first latch circuit 63, the sampling frequency conversion apparatus starts operating. Immediately after the operation starts, read rate FR for the FIFO 10 is lower than the write rate. Consequently, remaining data amount ΔS of the FIFO 10 increases. While remaining data amount ΔS is larger than the suitable value "8", positive correction number ΔT occurs correspondingly to a difference between remaining data amount ΔS and the suitable value "8". Consequently, frequency control information y(n) increases, and read rate FR increases.

Remaining data amount ΔS changes later than a change in read rate FR. Remaining data amount ΔS reaches the maximum value around where read rate FR reaches the suitable value ($f_1$). Remaining data amount ΔS then decreases there (time $t_{10a}$). Since remaining data amount ΔS is larger than the suitable value "8", positive correction number ΔT is still generated. Consequently, read rate FR continues to increase and reaches the maximum value where remaining data amount ΔS reaches the suitable value "8" (time $t_{11a}$). This is because correction number ΔT becomes ±0 when remaining data amount ΔS in the FIFO 10 reaches the suitable value. Since read rate FR is higher than the write rate ($f_1$), remaining data amount ΔS in the FIFO 10 continues to decrease. While remaining data amount ΔS is smaller than the suitable value "8", negative correction number ΔT occurs correspondingly to a difference between remaining data amount ΔS and the suitable value "8". Consequently, frequency control information y(n) decreases, and read rate FR decreases.

Remaining data amount ΔS changes later than a change in read rate FR. Remaining data amount ΔS reaches the minimum value around where read rate FR reaches the suitable value ($f_1$). Remaining data amount ΔS then increases there (time $t_{12a}$). Since remaining data amount ΔS is smaller than the suitable value "8", negative correction number ΔT is still generated. Consequently, read rate FR continues to decrease and reaches the minimum value where remaining data amount ΔS reaches the suitable value "8" (time $t_{13a}$). As mentioned above, this is because correction number ΔT becomes ±0 when remaining data amount ΔS in the FIFO 10 reaches the suitable value. Since read rate FR is lower than the write rate ($f_1$), remaining data amount ΔS in the FIFO 10 continues to increase subsequently. After this, remaining data amount ΔS and read rate FR cyclically repeat increasing and decreasing each with a specified constant amplitude. It is confirmed that the amplitude depends on the initial value of read rate FR. Accordingly, the prior art needs to possibly approximate the initial value of read rate FR to the suitable value so as to decrease the amplitudes of remaining data amount ΔS and read rate FR.

On the other hand, as will be described later, the embodiment solves this problem by providing control to generate correction number ΔT based on both remaining data amount ΔS and vector dΔS. In the example of FIG. 5(b), like FIG. 5(a), read rate FR is set to an initial value corresponding to specified amount ΔFR lower than the suitable value ($f_1$). After the initial value is assigned to the first latch circuit 63, the sampling frequency conversion apparatus starts operating. Immediately after the operation starts, read rate FR for the FIFO 10 is lower than the write rate. While vector dΔS indicates that remaining data amount ΔS is larger than the suitable value "8" and is increasing, positive correction number ΔT occurs correspondingly to a difference between remaining data amount ΔS and the suitable value "8". Consequently, frequency control information y(n) increases, and read rate FR increases.

Remaining data amount ΔS changes later than a change in read rate FR. Remaining data amount ΔS reaches the maximum value around where read rate FR reaches the suitable value ($f_1$). Remaining data amount ΔS then decreases there (time $t_{10b}$). Accordingly, vector dΔS does not indicate that remaining data amount ΔS is increasing. Correction number ΔT is assumed to be "0". As a result, read rate FR stops increasing. While vector dΔS does not indicate that remaining data amount ΔS is greater than or equal to the suitable value and is increasing, correction number ΔT is assumed to be "0" and read rate FR does not change. Since read rate FR is higher than the write rate ($f_1$) during this period, remaining data amount ΔS in the FIFO 10 continues to decrease. Remaining data amount ΔS becomes smaller than the suitable value "8" (time $t_{11b}$). While vector dΔS indicates that remaining data amount ΔS is smaller than the suitable value "8" and is decreasing, negative correction number ΔT occurs correspondingly to a difference between remaining data amount ΔS and the suitable value "8". Consequently, frequency control information y(n) decreases, and read rate FR decreases.

Remaining data amount ΔS changes later than a change in read rate FR. Remaining data amount ΔS reaches the minimum value around where read rate FR reaches the suitable value ($f_1$). Remaining data amount ΔS then increases there (time $t_{12b}$). At this time, remaining data amount ΔS is smaller than the suitable value "8". However, since vector dΔS does not indicate that remaining data amount ΔS is decreasing, correction number ΔT is assumed to be "0". As a result, read rate FR stops decreasing. While vector dΔS does not indicate that remaining data amount ΔS is smaller than or equal to the suitable value and is decreasing, correction number ΔT is assumed to be "0" and read rate FR does not change. Since read rate FR is lower than the write rate ($f_1$) during this period, remaining data amount ΔS in the FIFO 10 continues to increase. Remaining data amount ΔS becomes larger than the suitable value "8" (time $t_{13b}$). While vector dΔS indicates that remaining data amount ΔS is larger than the suitable value "8" and is increasing, positive correction number ΔT occurs correspondingly to a difference between remaining data amount ΔS and the suitable value "8". Consequently, frequency control information y(n) increases, and read rate FR increases. After this, remaining data amount ΔS and read rate FR cyclically repeat increasing and decreasing. During this period, the amplitudes gradually attenuate.

The reason follows. Even if the remaining data amount ΔS is greater than or equal to the suitable target value, the positive correction number ΔT is produced to suppress an increase in remaining data amount ΔS while the vector dΔS indicates that the remaining data amount ΔS is increasing. Even if the remaining data amount ΔS is smaller than or equal to the suitable value, the negative correction number ΔT is produced to suppress a decrease in the remaining data amount ΔS while the vector dΔS indicates that the remaining data amount ΔS is decreasing. This scheme prevents production of an excessive correction number ΔT that would adversely contribute to the vibrating fluctuation of the remaining data amount ΔS and the read rate FR.

There has been described in detail the first feature of the embodiment. Namely, the inventive method is designed for controlling data input and output operation of a FIFO buffer memory 10 to regulate a data amount residing in the FIFO buffer memory 10 around the target data of "8" for example. The inventive method is carried out by the steps of writing data successively into the FIFO buffer memory 10 at an variable input rate $f_1$ so that the data are accumulated in the FIFO buffer memory 10, reading the accumulated data successively from the FIFO buffer memory 10 at an variable output rate FR so that the data amount ΔS residing in the FIFO buffer memory 10, detecting a vector dΔS indicating a current direction of variation of the data amount ΔS residing in the FIFO buffer memory 10, generating control information in terms of a correction number ΔT according to both of the detected current data amount ΔS and the detected current direction of variation dΔS of the data amount ΔS, and regulating the output rate FR according to the control information ΔT so as to promptly converge the current data amount ΔS residing in the FIFO buffer memory to the target data amount "8". In detail, the generating step generates positive control information −ΔT effective to decrease the output rate FR if the detected current data amount ΔS is greater than the target data amount "8" and the detected current direction of the variation dΔS indicates that the residing data amount ΔS is increasing, and generates negative control information +ΔT effective to increase the output rate FR if the detected current data amount ΔS is smaller than the target data amount "8" and the detected current direction of the variation dΔS indicates that the residing data amount ΔS is decreasing.

The second feature of the embodiment lies in that the above-mentioned equation (1) is used as a condition to update pointers Valid0 and Valid1 in the vector detection circuit 51. The following describes effects provided by the use of the above-mentioned equation (1). From the viewpoint of stabilizing read rate FR for the FIFO 10, it is desirable to use a small threshold value for detecting increase and decrease in remaining data amount ΔS and detect a slight change in remaining data amount ΔS to determine the temporal variation in remaining data amount ΔS. The reason is that a small threshold value can cause a small amplitude of remaining data amount ΔS in an attenuation area where read rate FR for the FIFO 10 is converged. However, remaining data amount ΔS can take only integer values such as 0, 1, 2, 3, and so on. A possible solution is to use the smallest integer 1 as the threshold value for detecting changes in remaining data amount ΔS and use the following equation (3) as the update condition.

$$\text{Valid\_ptr} = \text{Valid0} \pm 1 \quad (3)$$

Even in a normal state, however, remaining data amount ΔS vibrates with an amplitude of ±1. Even though that update condition is used, this is merely equivalent to occurrence of the normal vibration. It is assumed that remaining data amount ΔS increases and decreases alternately. A vector to be obtained is far from the actual temporal variation in remaining data amount ΔS. To solve this problem, the embodiment uses the above-mentioned equation (1) as the update condition by assuming 2, i.e., the smallest integer but 1, to be the threshold value.

Figure 6:
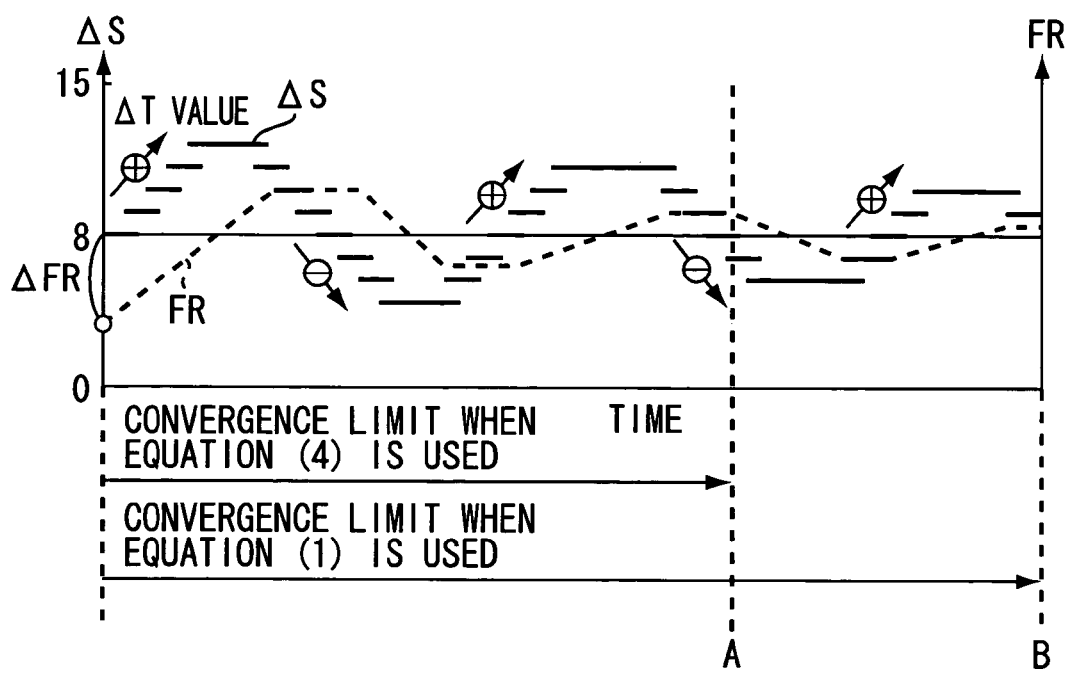
FIG. 6 shows the relationship among vector update conditions and convergence limits of read rate FR and remaining data amount $\Delta S$ of FIFO in the apparatus.

Setting the threshold to a value larger than 2 causes another problem different from that for the threshold value set to 1. FIG. 6 shows convergence limits of read rate FR and remaining data amount ΔS for the FIFO 10 with respect to cases of using equation (1) above and equation (4) to follow as update conditions.

$$\text{Valid\_ptr} = \text{Valid0} \pm 3 \quad (4)$$

In FIG. 6, let us pay attention to the example of using equation (4) as the update condition. When a change in remaining data amount ΔS falls into the range of ±2 at point A, the vector detection circuit 51 does not update pointers thereafter. It becomes impossible to further converge remaining data amount ΔS and read rate FR on the suitable value. When equation (1) is used as the update condition, however, the vector detection circuit 51 updates pointers at point A and later. It is possible to further converge remaining data amount ΔS and read rate FR on the suitable value. That is to say, using equation (1) instead (4) as the update condition extends the convergence limit for remaining data amount ΔS and read rate FR from point A to B and enables more efficient convergence on the suitable value.

As mentioned above, the embodiment generates correction number ΔT for suppressing the vibration based on remaining data amount ΔS and vector dΔS indicating its temporal variation only during a period useful to suppress the vibration of remaining data amount ΔS and read rate FR. Accordingly, it is possible to reduce vibration amplitudes of remaining data amount ΔS and read rate FR and prevent output data waveforms from being deformed. Further, the embodiment uses a change of ±2 in remaining data amount ΔS as the condition to update vector dΔS. It is possible to minimize amplitudes of normal signals for remaining data amount ΔS and read rate FR in a convergent state.

In the above-mentioned embodiment, the vector detection circuit 51 uses three pointers to detect four modes of the temporal variation in remaining data amount ΔS, i.e., increase in progress, decrease in progress, change from increase to decrease, and change from decrease to increase. Moreover, the vector detection circuit 51 may be provided with only two pointers to detect only two modes, i.e., increase in progress and decrease in progress. In this case, the conversion section 61 may control correction number ΔT as follows.

a. Generating positive correction number ΔT when ΔS is larger than the suitable value and is increasing.

b. Setting correction number ΔT to "0" when ΔS is larger than or equal to the suitable value and is decreasing.

c. Generating negative correction number ΔT when ΔS is smaller than the suitable value and is decreasing.

d. Setting correction number ΔT to "0" when ΔS is smaller than or equal to the suitable value and is increasing.

What is claimed is:

1. An asynchronous signal input apparatus comprising:
   a storage section that can successively store input data while the stored input data are successively read out such that a remaining data amount of the input data stored in the storage section may temporally vary around a predetermined target data amount;
   a write control section that successively writes the input data into the storage section in response to an input clock signal having a first frequency;
   a remaining data amount detection section that detects the remaining data amount of the input data stored in the storage section;
   a vector detection section that detects a temporal variation of the remaining data amount of the input data stored in the storage section;
   a loop filter section that generates a correction number based on both of the remaining data amount detected by the remaining data amount detection section and the temporal variation of the remaining data amount detected by the vector detection section, and that generates frequency control information based on the correction number;
   a read signal generation section that generates a read signal composed of a sequence of pulses occurring in synchronization with an output clock signal having a second frequency, such that an occurrence number of pulses per time is dynamically regulated according to the frequency control information; and
   a read control section that successively reads out the input data from the storage section in response to the sequence of pulses of the read signal regulated by the read signal generation section, so that the remaining data amount of the input data in the storage section converges to the predetermined target data amount.

2. The asynchronous signal input apparatus according to claim 1, wherein the vector detection section comprises a memory that stores a plurality of the remaining data amounts which are successively detected by the remaining data amount detection section and which include a last remaining data amount, a loader that stores a new remaining data amount newly detected by the remaining data amount detection section into the memory when there is a difference of ±2 pieces between the new remaining data amount and the last remaining data amount stored in the memory, and a detector that detects the temporal variation of the remaining data amount based on the plurality of the remaining data amounts which are stored in the memory and which include the last remaining data amount and the new remaining data amount.

3. The asynchronous signal input apparatus according to claim 1, wherein the loop filter section produces a positive correction number effective to suppress an increase of the remaining data amount if a detected remaining data amount is greater than the predetermined target data amount and a detected temporal variation indicates that the remaining data amount is increasing, and produces a negative correction number effective to suppress a decrease of the remaining data amount if the detected remaining data amount is smaller than the predetermined target data amount and the detected temporal variation indicates that the remaining data amount is decreasing.

4. The asynchronous signal input apparatus according to claim 1, wherein the write control section successively writes the input data composed of a predetermined number of bits into the storage section in response to the input clock signal having the first frequency.

5. A sampling frequency conversion apparatus comprising:
a storage section that can successively store input data while the stored input data are successively read out such that a remaining data amount of the input data stored in the storage section may temporally vary around a predetermined target data amount;
a write control section that successively writes the input data into the storage section in response to an input clock signal having a first frequency;
a remaining data amount detection section that detects the remaining data amount of the input data stored in the storage section;
a vector detection section that detects a temporal variation of the remaining data amount of the input data stored in the storage section;
a loop filter section that generates a correction number based on both of the remaining data amount detected by the remaining data amount detection section and the temporal variation of the remaining data amount detected by the vector detection section, and that generates frequency control information based on the correction number;
a read signal generation section that generates a read signal composed of a sequence of pulses occurring in synchronization with an output clock signal having a second frequency, such that an occurrence number of pulses per time is dynamically regulated according to the frequency control information;
a read control section that successively reads out the input data from the storage section in response to the sequence of pulses of the read signal regulated by the read signal generation section, so that the remaining data amount of the input data in the storage section converges to the predetermined target data amount;
an interpolation information generation section that generates interpolation information at each timing when the output clock signal is generated by the second frequency while the interpolation information is controlled based on the frequency control information generated from the loop filter section; and
an interpolation section that performs an interpolation operation to the input data read out from the storage section in accordance with the interpolation information generated by the interpolation information generation section so as to output interpolated input data corresponding to timing when the output clock signal is generated.

6. The sampling frequency conversion apparatus according to claim 5, wherein the vector detection section comprises a memory that stores a plurality of the remaining data amounts which are successively detected by the remaining data amount detection section and which include a last remaining data amount, a loader that stores a new remaining data amount newly detected by the remaining data amount detection section into the memory when there is a difference of ±2 pieces between the new remaining data amount and the last remaining data amount stored in the memory, and a detector that detects the temporal variation of the remaining data amount based on the plurality of the remaining data amounts which are stored in the memory and which include the last remaining data amount and the new remaining data amount.

7. The sampling frequency conversion apparatus according to claim 5, wherein the loop filter section produces a positive correction number effective to suppress an increase of the remaining data amount if a detected remaining data amount is greater than the predetermined target data amount and a detected temporal variation indicates that the remaining data amount is increasing, and produces a negative correction number effective to suppress a decrease of the remaining data amount if the detected remaining data amount is smaller than the predetermined target data amount and the detected temporal variation indicates that the remaining data amount is decreasing.

8. A method of controlling data input and output operation of a FIFO buffer memory to regulate a data amount residing in the FIFO buffer memory around a target data amount, the method comprising the steps of:
writing data successively into the FIFO buffer memory at a variable input rate so that the data are accumulated in the FIFO buffer memory;
reading accumulated data successively from the FIFO buffer memory at a variable output rate so that the data amount residing in the FIFO buffer memory varies temporally;
detecting a current data amount residing in the FIFO buffer memory;
detecting a current direction of variation of the data amount residing in the FIFO buffer memory;
generating control information according to both a detected current data amount and a detected current direction of variation of the data amount; and
regulating the variable output rate according to the control information so as to promptly converge the current data amount residing in the FIFO buffer memory to the target data amount, wherein
the generating step generates positive control information effective to decrease the variable output rate if the detected current data amount is greater than the target data amount and the detected current direction of the variation indicates that a residing data amount is increasing, and generates negative control information effective to increase the variable output rate if the detected current data amount is smaller than the target data amount and the detected current direction of the variation indicates that the residing data amount is decreasing.

* * * * *